United States Patent [19]

Moriyama

[11] Patent Number: 4,665,537

[45] Date of Patent: May 12, 1987

[54] DATA TRANSMISSION METHOD EMPLOYING THREE-DIMENSIONAL MATRICES INCLUDING CHECK WORDS

[75] Inventor: Yoshiaki Moriyama, Saitama, Japan

[73] Assignee: Pioneer Electronic Corporation, Tokyo, Japan

[21] Appl. No.: 654,574

[22] Filed: Sep. 26, 1984

[30] Foreign Application Priority Data

Sep. 26, 1983 [JP] Japan .................................. 58-178641

[51] Int. Cl.⁴ .............................................. G06F 11/10
[52] U.S. Cl. ......................................... 371/39; 371/50
[58] Field of Search ........................ 371/37, 39, 38, 40, 371/41, 50; 364/200, 900

[56] References Cited

U.S. PATENT DOCUMENTS

| | | | |
|---|---|---|---|
| 4,011,545 | 3/1977 | Nadir | 364/200 |
| 4,397,022 | 8/1983 | Weng | 371/37 |
| 4,564,945 | 1/1986 | Glover | 371/50 |

*Primary Examiner*—Michael R. Fleming

*Attorney, Agent, or Firm*—Sughrue, Mion, Zinn, Macpeak & Seas

[57] ABSTRACT

A data transmission method in which both random errors and burst errors in data transmission are correctable. A block of data is written at three-dimensional addresses in a memory in a predetermined writing order such that a three-dimensional data arrangement is formed. Check words are added in at least two of the directions as error detecting or error correcting codes to thereby form an extended three-dimensional data arrangement. The data is then read out of the extended three-dimensional data arrangement in a predetermined reading order and transmitted as data arranged one-dimensionally. On the data receiving side, the data including the check words is written into a memory in the same order as the data transmitting side to form a three-dimensional data arrangement therein, and then read out in the same order as the data writing order on the data transmitting side. The data thus read is subjected to error correction as required.

7 Claims, 9 Drawing Figures

DATA TRANSMISSION METHOD EMPLOYING THREE-DIMENSIONAL MATRICES INCLUDING CHECK WORDS

BACKGROUND OF THE INVENTION

The present invention relates to data transmission methods of transmitting data in blocks, and more particularly to a data transmission method in which both random error and burst error in a transmission system can be corrected. The term "transmission" as herein used is intended to include recording and reproducing as well as direct transmission through a communications path.

In a conventional data transmission method of this general type, data is arranged two dimensionally in matrix form, and check words are applied in horizontal (x) and vertical (y) directions in such a manner that an error detecting code is formed in the horizontal (x) direction and an error correcting code is formed in the vertical (y) direction before the data is transmitted. A typical data arrangement used with a stationary head multi-track recorder is shown in FIG. 1 as an example of such a method. In a stationary head multi-track recorder, the pattern shown in FIG. 1 is recorded on the tape. In the case where it is applied to a single track or single channel transmission system, the words $W_{11}$, $W_{12} \ldots W_{1l}$, $CRC_1$, $W_{21}$, $W_{22}$, $\ldots W_{2l}$, $CRC_2$, $\cdots$, $W_{m1}$, $W_{m2}$, $W_{ml}$, $CRC_m$, $P_1$, $P_2 \ldots P_l$, $CRC_{m+1}$, $Q_1$, $Q_2$, $\ldots Q_l$, and $CRC_{m+2}$ are transmitted word by word in the stated order. In FIG. 1, the data of $l \times m$ words is arranged two dimensionally in a matrix form, words horizontally and m words vertically. The words $CRC_1$ through $CRC_{m+2}$ are check words for detecting errors in the horizontal lines, and are generally 16 bits each. The other words (other than CRC) are k bits each. Furthermore, the words $P_x$ and $Q_x$ (where x=1 through l) are words for correcting errors in the vertical columns, forming Reed-Solomon codes in the vertical columns. The Reed-Solomon codes $P_x$ and $Q_x$ are so formed as to meet the following expressions:

$$\sum_{y=1}^{m} W_{yx} + P_x + Q_x = 0 \quad \sum_{y=1}^{m} \alpha^{m+2-y}W_{yx} + \alpha P_x + Q_x = 0, \text{ or,}$$

$$P_x = \frac{\sum_{y=1}^{m}(1 + \alpha^{m+2-y})W_{yx}}{1 + \alpha}$$

$$Q_x = \frac{\sum_{y=1}^{m}(\alpha + \alpha^{m+2-y})W_{yx}}{1 + \alpha},$$

where addition should be performed with modulo 2, and $\alpha$ is a Galois field primative element $GF(2^k)$ which during the tranmission is corrected as follows: On the data receiving side, with respect to error-including data and a check word, syndromes $S_{Px}$ and $S_{Qx}$ as defined below are obtained for each column:

$$S_{Px} = \sum_{y=1}^{m} W_{yx} + P_x + Q_x$$

$$S_{Qx} = \sum_{y=1}^{m} \alpha^{m+2-y}W_{yx} + \alpha P_x + Q_x.$$

It is assumed that, in the x-th column, two errors occur in the i-th and j-th words (i, j=1 to m), as a result of which $W_{ix}$ and $W_{ij}$ are changed to $W_{ix}' = W_{ix} + e_{ix}$ and $W_{jx}' = W_{jx} + e_{jx}$ (where $e_{ix}$ and $e_{jx}$ are the error patterns of $W_{ix}$ and $W_{jx}$, respectively).

Therefore:

$$S_{Px} = e_{ix} + e_{jx}$$

$$S_{Qx} = \alpha^{m+2-i}e_{ix} + \alpha^{m+2-j}e_{jx}.$$

From these expressions, $$e_{ix} = \frac{\alpha^{m+2-j}S_{Px} + S_{Qx}}{\alpha^{m+2-i} + \alpha^{m+2-j}}$$

$$e_{jx} = \frac{\alpha^{m+2-i}S_{Px} + S_{Qx}}{\alpha^{m+2-i} + \alpha^{m+2-j}}.$$

The errors of the lines are detected with $CRC_y$ (where y=1 to m+2), and the error positions i and j obtained. Therefore, the error patterns $e_{ix}$ and $e_{jx}$ can be obtained from the above expressions. The data values $e_{ix}$ and $e_{jx}$ thus obtained are added to the erroneous data $W_{ix}'$ and $W_{jx}'$ to obtain correct data as follows:

$$W_{ix}' + e_{ix} = W_{ix} + e_{ix} + e_{ix} = W_{ix}$$

$$W_{jx}' + e_{jx} = W_{jx} + e_{jx} + e_{jx} = W_{jx}.$$

In the case where the number of erroneous words is only one, one of the data values $e_{ix}$ and $e_{jx}$ should be considered as zero.

In the conventional data transmission method employing the data arrangement as shown in FIG. 1, if the number of lines in which errors occur is two or less, the errors can be corrected, even if they are burst errors of long lengths. However, in the case where the number of lines including errors is more than two, with the described method it is impossible to detect the columns in which the errors occurred, and therefore it is impossible to correct an error pattern as shown in FIGS. 2A and 2B in which the number of errors in a single column is two or less. In FIGS. 2A and 2B, the mark x indicates the positions of erroneous data, and the numeral "1" indicates positive results of error detection by CRC, namely, that error exists.

Accordingly, in the case of a transmission system in which random errors of short length occur frequently, the number of uncorrectable errors is increased and thus it is impossible to correctly transmit data. In the case where the data has a high degree of correlation as in the case of PCM audio data, the effect of uncorrectable errors can be somewhat decreased by a correcting method such as an average interpolation method. However, in the case of data such as computer software, the erroneous data cannot be corrected in this manner, thus resulting in the erroneous operation of the system. Accordingly, the data transmission method employing the data arrangement as shown in FIG. 1 is unsuitable for the transmission of computer software in a transmission system in which random errors occur frequently.

SUMMARY OF THE INVENTION

In view of the above-described drawbacks of the prior art, an object of the present invention is to provide a data transmission method in which both random errors and burst errors in data transmission can be sufficiently corrected.

In the data transmission method of the invention, one block of data is written at three-dimensional memory addresses in a predetermined writing order so that a three-dimensional data arrangement is formed, and at least in two of the directions check words are added as error detecting or correcting codes to form an extended three-dimensional data arrangement. Thereafter, the data is read out of the extended three-dimensional data arrangement in a predetermined reading order and transmitted as data arranged one dimensionally. On the data receiving side, the data including the check words is written into a memory in the same order as the data reading order on the data transmitting side to form a three-dimensional data arrangement therein, and then read out in the same order as the data writing order on the data transmitting side. The data thus read is subjected to error correction as required.

DESCRIPTION OF THE PREFERRED EMBODIMENTS

Figure 3:
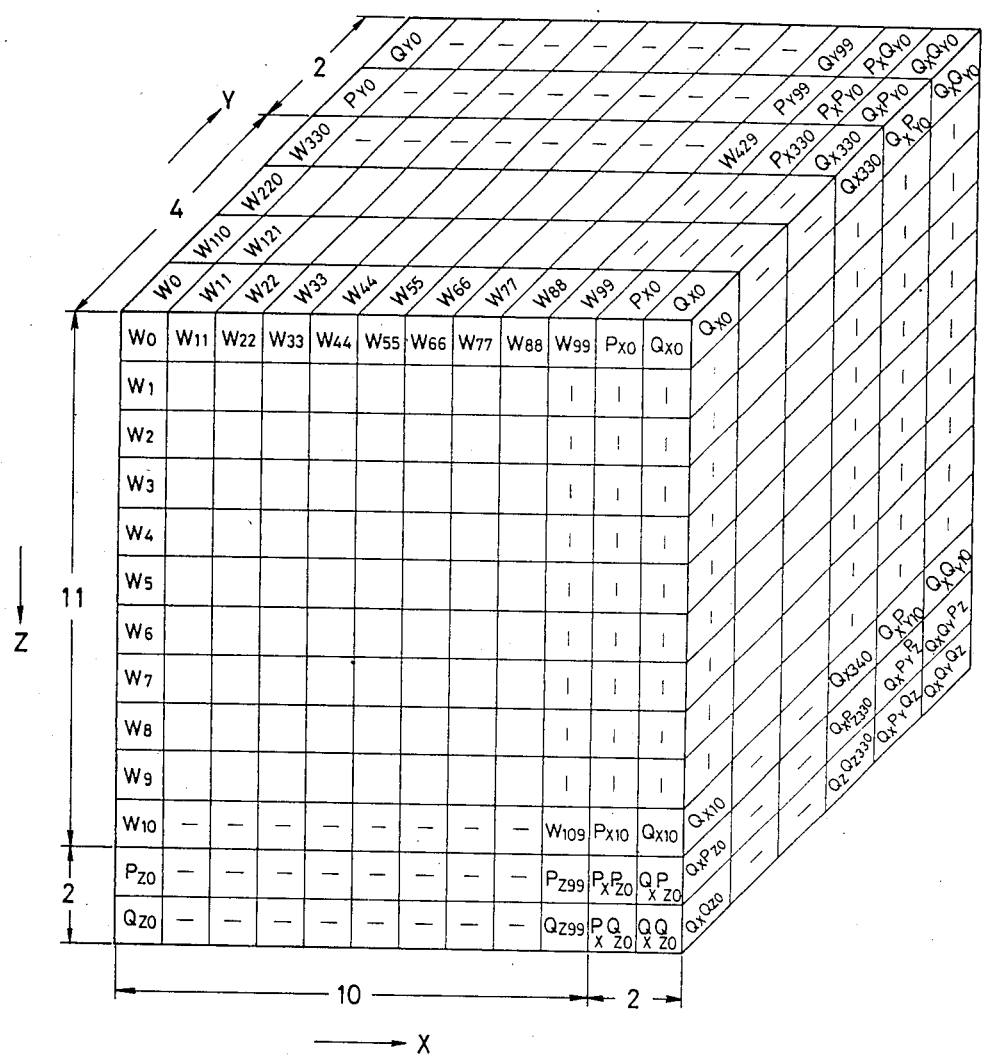
FIG. 3 is a diagram showing a data arrangement and code formation in accordance with a preferred embodiment of the invention.

Preferred embodiment of the invention will be described with reference to the drawings. FIG. 3 shows the arrangement of data and the construction of an error correcting code in a data transmission method according to the invention. The data $W_0$ through $W_{439}$ of one block (440 words in this example) is arranged in the form of a rectangular parallelopiped, 10 words in the X direction, four words in the Y direction and 11 words in the Z direction. Check words P and Q in the form of a Reed-Solomon code in each of the X, Y and Z directions, and one pair of these check words in each direction forms a code word. Each of the suffix letters X, Y and Z of the characters P or Q indicates the direction of the code word including the check word, and each of the suffix numerals corresponds to the number of the top word of the code word. The word $P_X P_{Y0}$ is the check word $P_X$ in the X direction as well as the check word $P_Y$ in the Y direction, and indicates that the numbers of the top words $P_X$ and $P_Y$ in the directions are "0". The word $Q_X Q_Y Q_Z$ is the check word $Q_X$ in the X direction, the check word $Q_Y$ in the Y direction and the check word $Q_Z$ in the Z direction. This concept may be applied to other words expressed by the characters P and/or Q with suffixes. The reason why one word can be a check word in a plurality of directions is that the Reed-Solomon code is a linear code. It is assumed that each of the data and check words consists of eight bits, and the Reed-Solomon code is a code on $GF(2^8)$.

In the preferred embodiment, the data may be computer programs or audio digital data, and recording and reproducing this data performed on one and the same medium. The suffixes of the data words $W_0$ through $W_{439}$ indicate the order of the data words given to them before they are arranged three dimensionally. The data words are arranged in a buffer memory as shown in FIG. 3 and combined with the check words. The data words thus treated are read word by word in the order of X, Y and Z and recorded. That is, in the recording operation, the words are arranged as follows: $W_0$, $W_{11}$, ... $W_{99}$, $P_{X0}$, $Q_{X0}$, $W_{110}$, ... $W_{220}$ ... $W_{330}$ ... $W_{429}$, $P_{X330}$, $Q_{X330}$ ... $P_{Y0}$ ... $P_{Y99}$, $P_X P_{Y0}$, $Z_X P_{Y0}$, $Q_{Y0}$ ... $Z_{Y99}$, $P_X Q_{Y0}$, $Q_X Q_{Y0}$, $W_1$ ... $W_2$ ... $W_3$ ... $W_4$ ... $W_5$ ... $W_6$ ... $W_7$ ... $W_8$ ... $W_9$ ... $W_{10}$ ... $W_{109}$, $P_{X10}$, $Q_{X10}$ ... $Q_{340}$ ... $Q_X P_{Z330}$ ... $Q_X Q_{Y10}$, $P_{Z0}$ ... $P_{Z99}$, $P_X P_{Z0}$ ... $Q_X P_{Z0}$ ... $Q_X P_{Z330}$ ... $Q_X P_Y P_Z$ ... $Q_X Q_Y P_Z$ ... $Q_{Z0}$ ... $Q_{Z99}$, $P_Z Q_{Z0}$, $Q_X Q_{Z0}$ ... $Q_X Q_{Z330}$ ... $Q_X P_Y Q_Z$ ... $Q_X Q_Y Q_Z$.

On the data reproducing side, the words are arranged in a buffer memory again as shown in FIG. 3 and subjected to error correction, and the words thus treated are read in the order of X, Y and Z to obtain the initial data word sequence. The reason why the order in arrangement of the words is changed in the recording operation is that, in the case where a considerably large number of errors occurs in the reproduced data and there is some uncorrectable data, the errors are dispersed when the data is restored into the initial data word arrangement. This rearrangement is effective in reducing the effects of errors in the case where the data is time-series data such as audio digital data.

The error correcting operation on the data reproducing side will now be described. In general, the data which is reproduced and arranged again as shown in FIG. 3 includes burst errors which have a relatively small frequency of occurrence but long length, and random errors which have a relatively large frequency of occurrence but short length.

In each direction, the Reed-Solomon code is the same as that described with reference to the prior art, and if the error position is known, an error of two words can be corrected. In addition, if the error position is not known, an error of one word can be corrected. These corrections are performed as follows: As in the conventional case, syndromes $S_{PU}$ and $S_{QU}$ (where U=X, Y or Z) defined by the following equations are calculated:

$$S_{PU} = \sum_{k=1}^{v} W_k + P_u + Q_u,$$

$$S_{Qu} = \sum_{k=1}^{v} \alpha^{v+2-k} W_k + \alpha P_u + Q_u,$$

where v is 10, 4 or 11, respectively, for X, Y or Z and k indicates the position of the data word in the code word, the top being 1.

If two-word errors occur at positions i and j, and their error patterns are represented by $e_i$ and $e_j$, respectively, then $$S_{PU} = e_i + e_j,$$

$$S_{QU} = \alpha^{v+2-i} e_i + \alpha^{v+2-j} e_j.$$

Therefore, $$e_i = \frac{\alpha^{v+2-j}S_{PU} + S_{QU}}{\alpha^{v+2-i} + \alpha^{v+2-j}},$$

$$e_j = \frac{\alpha^{v+2-i}S_{PU} + S_{QU}}{\alpha^{v+2-i} + \alpha^{v+2-j}}.$$

Thus, when the positions i and j are known, $e_i$ and $e_j$ can be obtained from the above equations and the errors corrected.

If a one-word error occurs at a position i and the error pattern is represented by $e_i$, then:

$$S_{PU} = e_i,$$

$$S_{PQ} = \alpha^{v+2-i} e_j.$$

Therefore, $$\alpha^i = \alpha^{v+2} \frac{S_{PU}}{S_{QU}}.$$

If the position i is not known, i can be obtained by obtaining $\alpha^i$ from $S_{PU}$ and $S_{QU}$. Thus, $e_i$ becomes $S_{PU}$ itself.

In FIG. 3, the words in the X direction are continuous on the recording medium, and therefore errors of three words or more are often contiguous to each other. Accordingly, in the X direction the error correction is generally more difficult than in the Y and Z directions. Therefore, is it desirable for that, in the X direction, only error detection is carried out as in the case of the above-described CRC, and an error flag, indicating the fact that, if $S_{PX} = S_{QX} = 0$ is not satisfied, an error exists, added to each code word in the X direction, and that, in the Y and Z directions, using this value as indicative of the error position, error correction is carried out.

Figure 1:
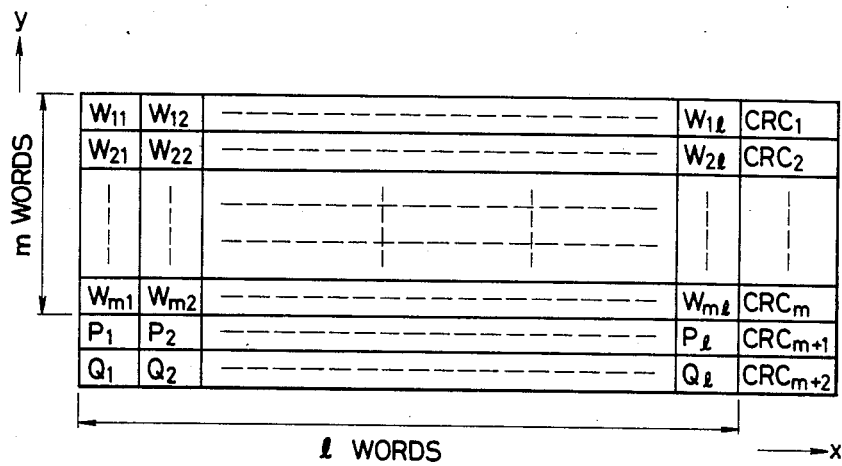
FIG. 1 is a diagram showing an example of data arrangement and code formation in a conventional data transmission method.
Figures 2A, 2B:
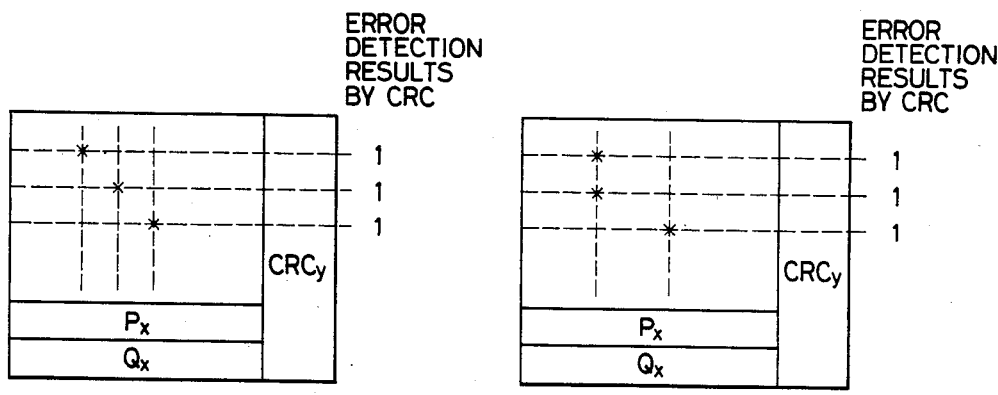
FIGS. 2A and 2B are diagrams showing error patterns which cannot be corrected by the conventional method.
Figure 4A:
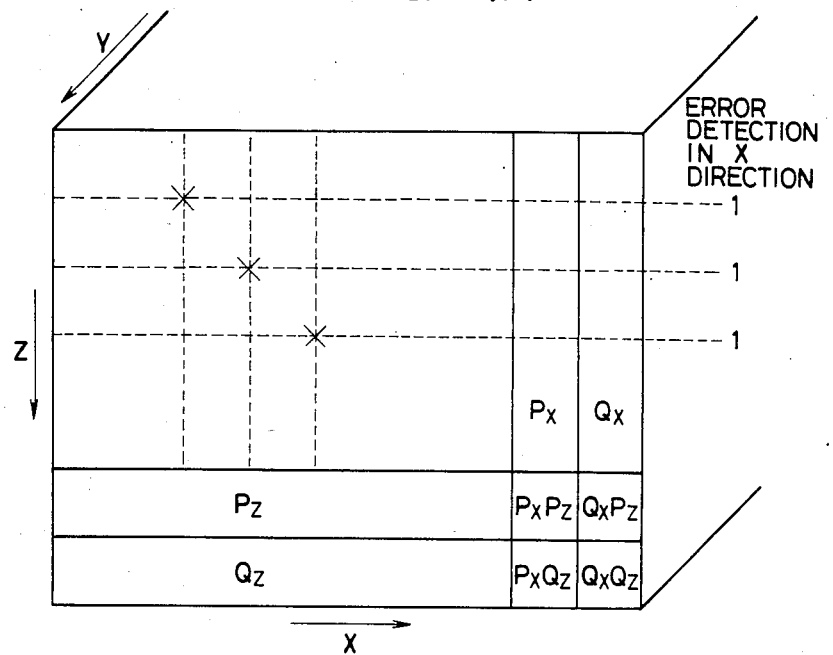
FIGS. 4A and 4B diagrams showing patterns which can be corrected by the method of the invention.
Figure 4B:
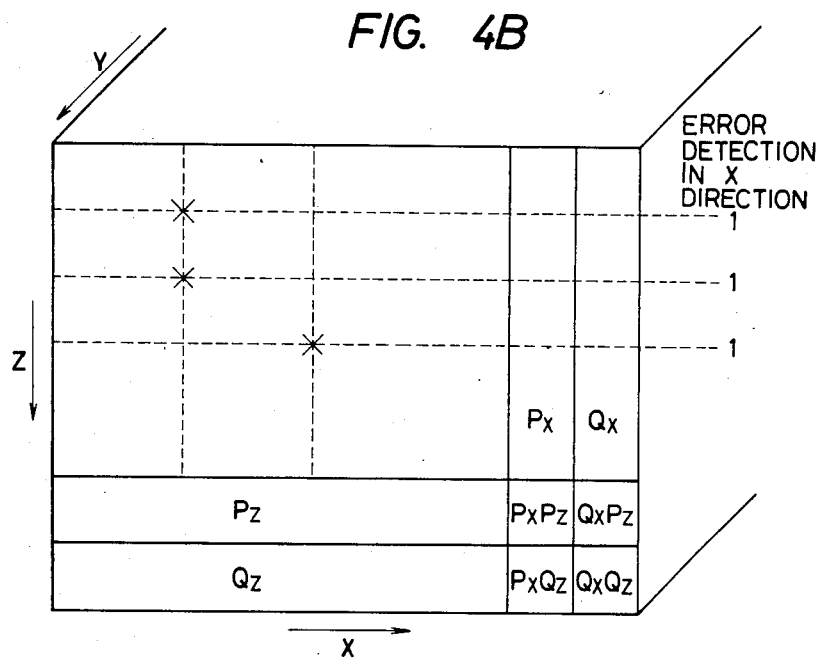

FIGS. 4A and 4B show examples of an error pattern in the X-Z plane. In the case of FIGS. 2A and 2B, these errors cannot be corrected by the conventional technique. However, using the data transmission method according to the invention, error correction is carried out in both the Z and Y directions. Therefore, even if a word has an error, it can be corrected as long as no uncorrectable error pattern is present in both the Z and Y directions. Accordingly, the patterns of FIGS. 4A and 4B can be corrected in the Y direction. Furthermore, the possibility that, even if the error is corrected incorrectly in the Z direction, it is corrected correctly in the Y direction is high; that is, the probability of error correction is high. Therefore, error patterns which cannot be corrected using the prior art method can be corrected with the use of the invention. For instance, all the error data in FIG. 4A and the error data on the right side of FIG. 4B can be corrected only in the Z direction by performing one-word error correction with the error positions obtained from $S_{PZ}$ and $S_{QZ}$. However, in this case, sometimes two-word error on the left side of FIG. 2B cannot be corrected. That is, the error pattern of FIGS. 4A and 4B cannot be corrected by the prior art approach. On the other hand, according to the preferred embodiment, even if an error is corrected incorrectly in the Z direction, it can still be corrected correctly in the Y direction, and therefore the pattern may be corrected in the Z direction.

With error correction carried out as described above, when error patterns as shown in FIGS. 4A and 4B occur simultaneously in a plurality of planes such as the X-Y and X-Z planes, the probability of correcting them is very high. Accordingly, even if many words have errors at random in the block of FIG. 3, they can be corrected in many cases; that is, the invention provides a high random error correction capability.

Moreover, since the words included in the code words in the Y and Z directions are distributed over the recording medium, long burst errors can be corrected. Furthermore, if error correction is repeatedly carried out alternately in the Y and Z directions, the correcting capability can be further improved. This method is effective in the case where a number of random errors are included in the data, or in the case where random errors and burst errors are mixed in the data. In the described embodiment, a single code type is employed in the X, Y and Z directions. Therefore, error detection or correction in the three directions can be achieved in a time-division manner by a single circuit, and therefore the amount of hardware in the circuit can be decreased as much.

In the above-described embodiment, a Reed-Solomon code having two check words is employed. The relationships between the error correcting capability of Reed-Solomon code and the number of check words is such that the number of check words may be changed in accordance with the required error correcting capability. That is:

(1) when the error positions are known, (the number of correctable words) = (the number of check words), and (2) when the error positions are not known, (the number of correctable words) =

$$\left( \frac{\text{(the number of check words)}}{2} \right)$$

where $<x>$ is the largest integer smaller than x.

Substantially the same effect as that of the above embodiment can be obtained by using an adjacent error correcting code instead of a Reed-Solomon code. According to the contents of data and the nature of the recording medium used, other codes may be selectively employed, or plural codes may be used in combination. However, it should be noted that if different kinds of codes are employed in the X, Y and Z directions, then it is necessary to provide an error detecting or correcting circuit for each of the different kinds of codes.

In the above-described embodiment, the error detection is performed in the X direction and error correction carried out in the Y and Z directions. However, if the errors in the reproduced data, in the case of short random errors, can be sufficiently corrected even in the X direction, the error correction may be performed in all of the X, Y and Z directions. In the case where the error correcting capability is allowably lower, and it is required to decrease the number of check words, the check words $P_X Q_X$ in the X direction, which is the direction to be read firstly on the data transmitting side, may be eliminated. The number of correctable words is thereby decreased; however, even if the error positions are not known, the error correction can still be achieved. In this case also, the error patterns in FIGS. 4A and 4B can be corrected by performing the error correction both in the Y and Z directions.

In the above-described embodiment, one type of code is employed in all directions, and the lengths of the codes, namely, the numbers of words, in the X, Y and Z directions, are ten, four and 11, respectively. If not only the kinds of codes but also the lengths of the codes can be made the same for all directions, not only the error detecting or correcting circuits but also the operation controls can be the same. In this case, the circuitry can be further simplified.

Figure 5:
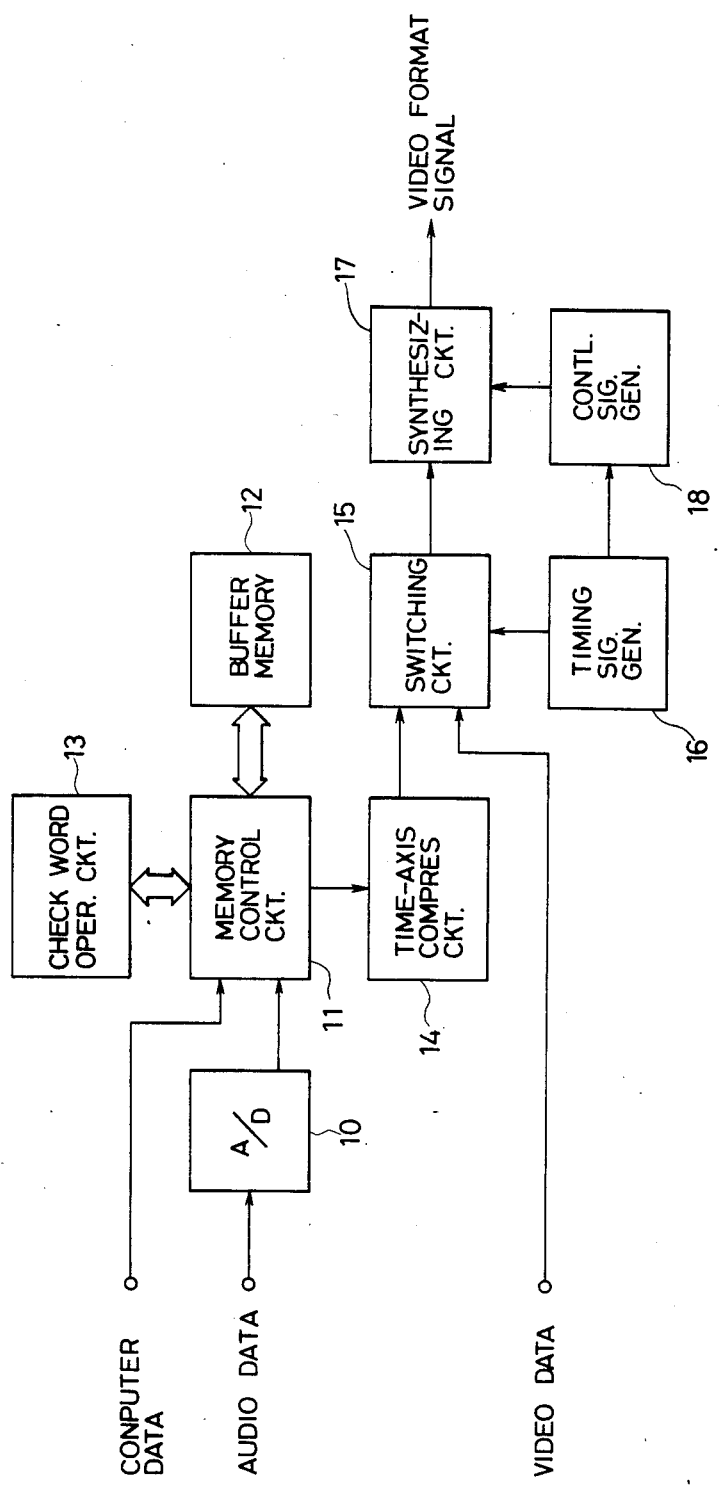
FIG. 5 is a block diagram showing one application of the invention.
Figure 6:
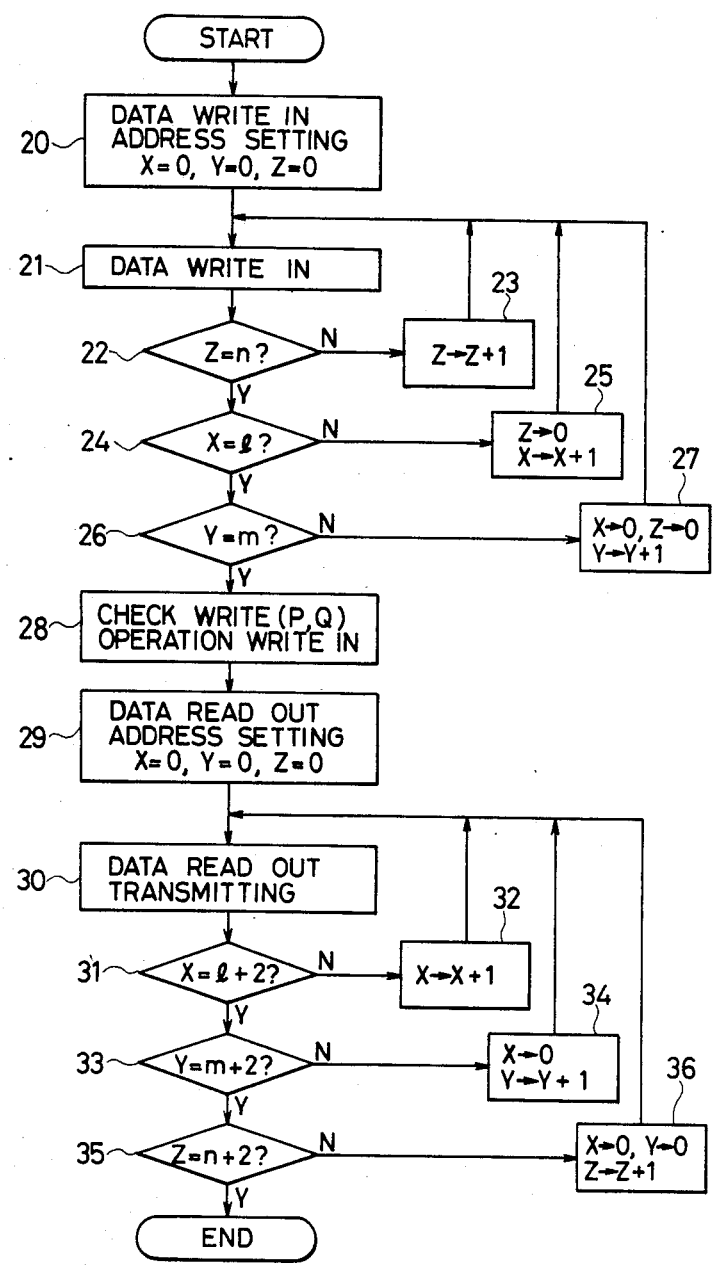
FIG. 6 a flowchart showing the operation of the device in FIG. 5.

FIG. 5 shows a video format signal generating device for practicing the data transmission method of the invention described with reference to FIGS. 3, 4A and 4B. The device has an A/D converter 10 which converts an audio signal into a digital signal by PCM or the like. The digital signal, which may be audio data in groups of 440 words, for instance, is applied through a memory control circuit 11 to a buffer memory in a predetermined writing order where it is stored three-dimensionally as shown in FIG. 3. The data writing order is indicated as Steps 20 through 27 in a flowchart shown in FIG. 6. In this case l words are arranged in the X direction, m words in the Y direction and n words in the Z direction. The data thus stored is read, as code words, out of the buffer memory 12 for everyline in the X, Y and Z directions. Check words are produced in a check word operating circuit 13, as shown in FIG. 3, and are stored in the buffer memory 12 (Step 28). Then, a time-axis compression circuit 14 and the memory control circuit 11 cooperate to read the data, which together with the check data has been arranged three-dimensionally as shown in FIG. 3, out of the buffer memory 12 in the predetermined reading order (Steps 29 through 36). The data thus read and arranged one dimensionally is supplied to a switching circuit 15 to which a video signal is suplied. The switching circuit 15 selectively applies the audio data and the video signal to a synthesizing circuit 17 in response to a timing signal from a timing signal generating circuit 16. The synthesizing circuit 17 operates to synthesize the audio data or video data thus applied and a control signal supplied by a control signal generating circuit 18 into a desired video format signal such as a still-picture-with-sound signal. The video format signal thus obtained is recorded on a recording medium such as a video disk and reproduced as desired.

Figure 7:
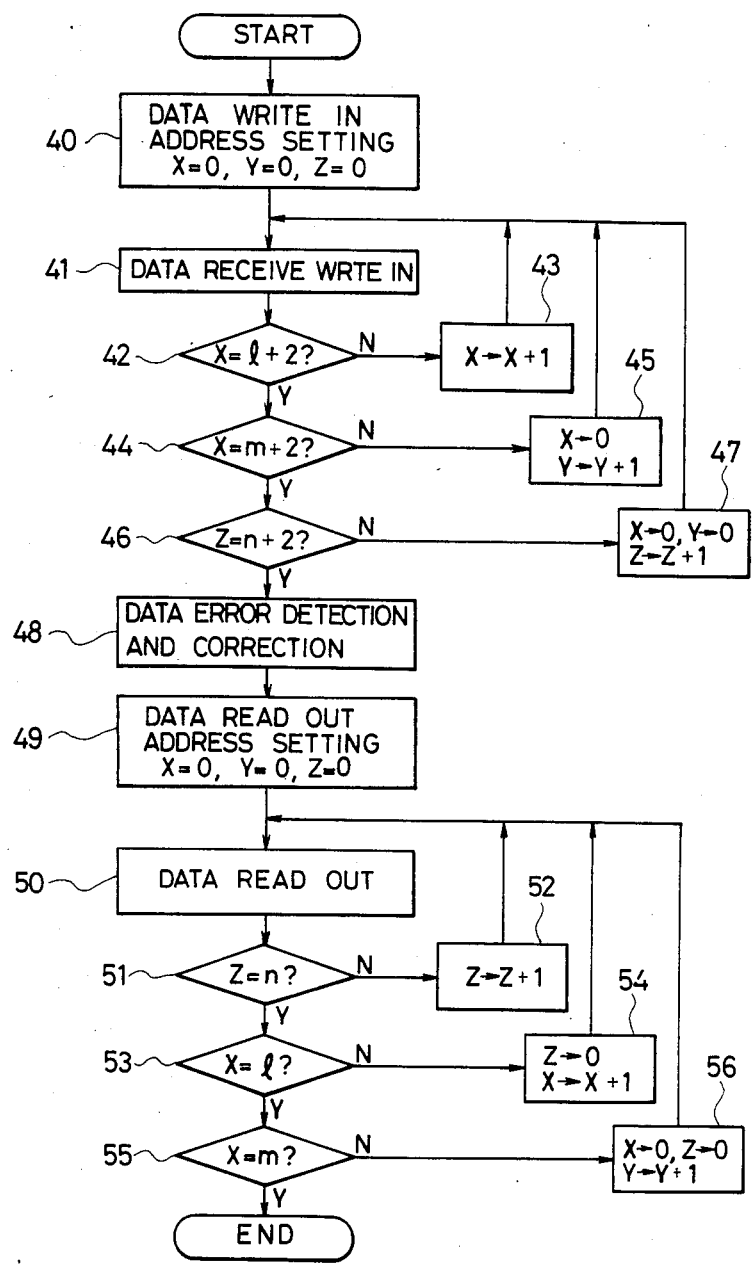
FIG. 7 is a flowchart showing an example of a data reproducing operation.

In reproducing the video format signal, as shown in FIG. 7, the data is written into the buffer memory in a data writing order corresponding to the data reading order in the recording operation (Steps 40 through 47), subjected to error detection and correction (Step 48), and read out of the buffer memory in a data reading order corresponding to the data writing order in the recording operation or that on the data transmitting side so that the original data is obtained.

In the case of recording and reproducing data other than audio data such as computer program digital data, the data is applied directly (without passing through the A/D converter) to the memory control circuit 11, and the data thus applied is then processed similarly to the case of audio data.

As is apparent from the above description, according to the invention, one block of data is arranged three-dimensionally in the form of a rectangular parallelopiped, and the error detecting or correcting codes are formed in all three dimensions before the data is transmitted or stored. Therefore, in the method of the invention, both random errors and burst errors which occur in the transmission system can be corrected with high efficiency. Moreover, errors which cannot be corrected by the prior art method can be corrected on the data receiving side.

I claim:

1. A data transmission method, comprising the steps of:
    writing a block of data consisting of N words in a memory at memory addresses in a predetermined writing order such that said data is arranged three-dimensionally with l words in an X direction, m words in a Y direction and n words in a Z direction, where $N = l \times m \times n$ and l, m and n are natural numbers;
    in at least two of said X, Y and Z directions, providing check words to form an extended three-dimensional data arrangement in a predetermined reading order, check words added in a direction in which data is read with a first priority being error detecting codes, and check words added in the remaining two direction being error correcting codes; and
    transmitting said data arrangement.

2. The data transmision method as claimed in claim 1, wherein said predetermined writing order is different from said predetermined reading order.

3. The data transmission method as claimed in claim 1, wherein, in reading said data in said predetermined reading order, check words are added in two directions other than a direction in which said data is read with a first priority.

4. The data transmission method as claimed in claim 1, wherein a single type of code is employed for said check words in said three directions.

5. The data transmission method as claimed in claim 4, wherein said type of code is a Reed-Solomon code.

6. The data transmission method as claimed in claim 4, wherein said check words are adjacent error correcting codes.

7. The data transmision method as claimed in claim 1, wherein numbers of words in said three directions are equal to one another in said extended three-dimensional data arrangement.

* * * * *